United States Patent
Mutnury et al.

(10) Patent No.: US 8,456,928 B2
(45) Date of Patent: Jun. 4, 2013

(54) DYNAMIC ADJUSTMENT OF REFERENCE VOLTAGE IN A COMPUTER MEMORY SYSTEM

(75) Inventors: Bhyrav M. Mutnury, Austin, TX (US); Nam H. Pham, Round Rock, TX (US); Terence Rodrigues, Jr., Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 541 days.

(21) Appl. No.: 12/785,697

(22) Filed: May 24, 2010

(65) Prior Publication Data
US 2011/0286288 A1 Nov. 24, 2011

(51) Int. Cl.
*G11C 5/14* (2006.01)

(52) U.S. Cl.
USPC ............... 365/189.09; 365/226; 365/210.12; 365/233.13; 365/230.1

(58) Field of Classification Search
USPC .................. 365/189.09, 210.12, 226, 233.13, 365/230.01
See application file for complete search history.

(56) References Cited

U.S. PATENT DOCUMENTS

| | | |
|---|---|---|
| 4,475,210 A | 10/1984 | Couch |
| 5,187,429 A | 2/1993 | Phillips |
| 6,347,367 B1 | 2/2002 | Dell et al. |
| 6,807,650 B2 | 10/2004 | Lamb et al. |
| 6,865,115 B2 | 3/2005 | Mazumder et al. |
| 6,985,009 B2 | 1/2006 | Nishio et al. |
| 7,230,449 B2 | 6/2007 | Dreps et al. |
| 7,236,894 B2 | 6/2007 | Oh et al. |
| 7,333,364 B2 | 2/2008 | Yu et al. |
| 7,372,764 B2 | 5/2008 | Nautiyal et al. |
| 7,411,806 B2 | 8/2008 | Funaba et al. |
| 8,274,856 B2 * | 9/2012 | Byeon ........................ 365/226 |
| 2002/0064077 A1 * | 5/2002 | Kobayashi et al. ........ 365/226 |
| 2005/0168271 A1 | 8/2005 | Brox |
| 2009/0290439 A1 | 11/2009 | Chang et al. |
| 2011/0141827 A1 * | 6/2011 | Mozak et al. ........... 365/189.09 |

OTHER PUBLICATIONS

Rivet, et al. "Powering DDR Memory in Desktop Computers and Datacomm Systems", Intersil Americas Inc./Intersil Corporation, Power Management Products Group, pp. 1-14.

* cited by examiner

*Primary Examiner* — Vu Le
*Assistant Examiner* — Han Yang
(74) *Attorney, Agent, or Firm* — Thomas E. Tyson; Jeffrey L. Streets

(57) ABSTRACT

A method provides improved signal quality in a computer memory system. In one embodiment, a digital signal is generated having a voltage interpreted with respect to a reference voltage. The reference voltage is dynamically adjusted as a function of the traffic intensity at which the digital signal is directed to a particular receiver. A training phase may be performed for each DIMM of the memory system, to construct a lookup table correlating suitable reference voltages with different traffic intensities. The lookup table may be referenced during a subsequent execution phase, to dynamically select a reference voltage according to changing traffic intensity. The dynamically selected reference voltage value may be enforced by using transistors to selectively recruit resistors of a resistor network.

14 Claims, 6 Drawing Sheets

DYNAMIC ADJUSTMENT OF REFERENCE VOLTAGE IN A COMPUTER MEMORY SYSTEM

BACKGROUND

1. Field of the Invention

The present invention relates to improving signal quality in a digital signaling system, such as a computer system memory.

2. Background of the Related Art

Digital signaling systems used in computers employ a driver for generating a digital signal and a receiver for receiving the digital signal. For example, a computer memory system may include a processor including a driver to generate an I/O (input/output) signal, and a memory module including a receiver. The signal generated by a digital signaling system is a time-dependent voltage signal used to represent different logic levels, such as a logical "0" and "1." At the receiver, the voltage of the signal may be compared with a reference voltage (Vref) to determine which logic state is being represented at each instance of a clock signal. Some amount of noise is typically present in the channel, which affects the signal voltage. Therefore, it is desirable to maximize the voltage margin between the signal and the reference voltage. A fixed Vref value is typically set during an initial training phase.

As computer technology advances, processor speeds continue to increase, creating a demand for faster memory systems capable of keeping pace with the increasing processor speeds. Faster memory bus speeds are facilitated, in part, by reducing the voltages of I/O data signals, to avoid excessive transition time from one signal level to another (e.g. from a logical "0" to "1"). However, reducing the signal voltage also reduces the voltage margin between the signal voltage and the Vref with which the signal is compared to identify a logical value. If the magnitude of the fixed reference voltage is not suitable, then the available voltage margin may be inadequate and result in reduced signal reliability.

BRIEF SUMMARY

One embodiment of the present invention provides a method, which may be implemented in a digital signaling system to improve signal quality. According to the method, a digital signal is generated. A reference voltage is also generated, with respect to which the digital signal is interpreted. A target memory module is selectively addressed from among a plurality of memory modules. Traffic intensity to the target memory module is monitored. The value of the reference voltage may be dynamically adjusted as a function of the changing traffic intensity, such as to select a reference voltage value providing reliable interpretation of the digital signal for the current value of traffic intensity.

An alternative embodiment provides a method, wherein a digital signal is received at a target memory module. The received digital signal is interpreted with respect to a reference voltage. Traffic intensity of the received digital signal is monitored. The reference voltage is dynamically adjusted as a function of the changing traffic intensity.

Either method may be performed, at least in part, using a computer program product that includes computer usable program code embodied on a computer usable storage medium. The computer program product includes computer usable program code allowing a computer or a machine comprising a computer to implement the various steps of the method.

Another embodiment of the invention provides a digital signaling system, including a memory controller having a driver configured for generating a digital signal. A memory module has a receiver in communication with the driver. The driver is configured for selectively directing the digital signal to the receiver of the memory module. A voltage control module is configured for determining a traffic intensity at which the digital signal is directed to the receiver and dynamically adjusting the reference voltage as a function of the traffic intensity at which the digital signal is directed to the receiver.

DETAILED DESCRIPTION

Figure 1:
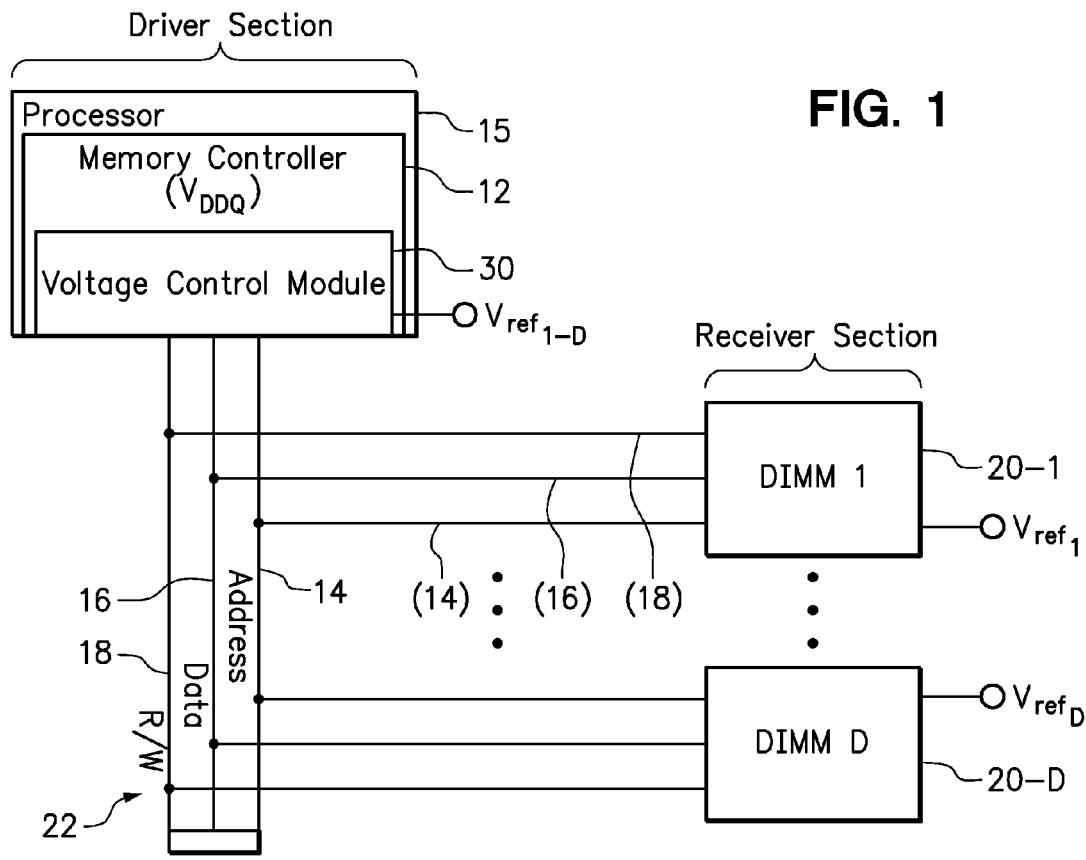
FIG. 1 is a schematic diagram of a computer memory system in which a reference voltage is dynamically adjusted according to an embodiment of the invention.

Embodiments of the present invention are directed to improving digital signal quality in digital signaling systems by dynamically adjusting a reference voltage (Vref) in relation to the traffic intensity targeted to a digital signal receiver. The digital signal is interpreted by comparing the value of the digital signal with respect to the value of Vref to determine whether the digital signal is intended to represent a binary "1" or "0" at a particular instant or at a given clock signal. In a digital signaling system having multiple receivers, the particular receiver(s) being targeted at any given moment may be referred to as the "target receiver." More particularly, the digital signaling system may be a digital memory system having a plurality of memory modules, where each memory module includes a respective one of the receivers. The traffic intensity for a given receiver may be quantified as the number of times the target receiver is addressed or otherwise accessed during a predefined interval.

The traffic intensity to the target receiver affects the noise levels in a manner that asymmetrically alters the signal waveform. This may be evidenced in an eye diagram by one or more change in, for example, the eye shape, eye height, eye width, and DC offset in relation to a change in traffic intensity. According to one aspect of the inventive embodiment, the value of Vref may be dynamically adjusted during digital signal transmission to account for the variability in the signal waveform due to the intensity of the signal traffic to the target receiver. For example, the Vref level may be continuously shifted up or down as a function of the intensity to improve or optimize the value of Vref during signal transmission.

In the example embodiment of a digital signaling system discussed below, a computer memory system has a shared memory controller acting as the driver and a plurality of DIMMs (dual in-line memory modules), where each DIMM includes a separate receiver. The DIMMs may be selectively addressed by the memory controller, to selectively route a digital signal to the various DIMMs. The specific DIMM being addressed at a given instant may be referred to as the "target receiver," or more specifically as the "target DIMM." Any one of the plurality of DIMMs that are in communication with the memory controller may be the target DIMM at a given instant, as marked by a clock signal. The particular DIMM being targeted may change rapidly from one DIMM to another DIMM in successive clock signals as the memory controller communicates with different DIMMs in the memory system.

A voltage control module may be provided to adjust the reference voltage used by a target receiver in relation to the intensity of the signal traffic to the various DIMMs. Although the intensity of the signal traffic to a DIMM may be determined in a number of different ways within the scope of the present invention, one embodiment provides a voltage control module that includes a counter to track signal traffic to the DIMMs (a separate counter may be provided for each DIMM/ receiver). When an address comparator detects that an incoming address lies within the address range assigned to a DIMM, the counter for that DIMM is incremented. Periodically, such as at predefined intervals, a latch captures the value of the counter as a measure of the intensity of the signal traffic to the DIMM. The traffic intensity is used as an index into a table of empirical data relating traffic intensity with an appropriate Vref for the DIMM. The selected Vref value may then be enforced by changing the value of resistance in a Vref leg of the circuit to cause a corresponding change in Vref.

FIG. 1 is a schematic diagram of a computer memory system 10 according to an embodiment of the invention. The memory system 10 includes a memory controller 12 for communicating with (e.g. reading and writing to) a number "N" of DIMMs 20 over a memory bus 22. The DIMMs 20 are individually referred to in FIG. 1 as "DIMM 1" through "DIMM D." The DIMMs 20 are a volatile storage component for storing instructions executable by a processor 15, such as a CPU (central processing unit). The memory controller 12 is a digital circuit which manages the flow of data going to and from the main memory. The memory controller 12 contains logic for reading and writing dynamic random access memory (DRAM) and to periodically refresh the individual DRAM chips included with the DIMMs 20. The memory controller 12 can be embodied in an integrated circuit chip that may or may not be exclusively dedicated to the functions of the memory controller. For example, in the embodiment of FIG. 1, the memory controller 12 resides on the same chip as a CPU 15 that accesses and executes instructions stored in volatile memory on the DIMMs 20. The memory system 10 is an example of a digital signaling system, wherein the memory controller 12 includes the driver and each DIMM 20 includes a digital signal receiver that can be selectively targeted by the memory controller 12. At any given instant, the memory controller 12 may communicate with any one or any subset of the DIMMs 20. The specific DIMM 20 being targeted at any given instant may be referred to as the target DIMM.

The memory controller 12 generates various I/O signals for communicating with the DIMMs 20 over the bus 22. The bus 22 may include, e.g., address line(s) 14, data line(s) 16, and read/write (R/W) control line(s) 18 between the memory controller 12 and the DIMMs 20. The term "line" or "lines" is used herein consistent with its ordinary meaning in the computer arts to include conductive wires, traces, interconnects and the like. Each DIMM 20 includes a number of address registers (not shown), as generally understood in the art. Address lines 14 are used to communicate memory addresses that specify the address registers to be used in a read or write operation. R/W control lines 18 are used to instruct a DIMM 20 containing the register(s) being addressed whether data is intended to be read from or written to the registers. The data lines 16 are used to communicate the actual data to be written to or read from the DIMMs 20 in a binary format. The memory controller 12 uses its driver to generate a digital signal in the form of a time-varying voltage, wherein an upper value range of voltage specifies a logical "1" and a lower value range of voltage specifies a logical "0." At the target DIMM, a receiver compares the received signal voltage with a reference voltage Vref to interpret the signal, such as to discern and distinguish between the encoded 0s and 1s.

Each DIMM 20 may have many pins (not shown), where each pin is individually in communication with the memory controller 12 over a separate signal line on the bus 22. Each signal line may behave as a transmission line, which are vulnerable to certain noise components such as capacitive noise coupling between adjacent signal lines (transmission lines). Under idle conditions, noise levels are low. As activity increases to the maximum level possible, noise levels also increase, which changes the optimal Vref value.

A voltage control module (VCM) 30 is provided on the memory controller 12 to dynamically adjust the reference voltage Vref to each DIMM 20 as a function of the intensity of the signal traffic to each DIMM 20. The intensity may be quantified as a rate at which a particular DIMM 20 is addressed by the memory controller 12. For example, the intensity may be quantified according to the number of times the target DIMM is addressed by the memory controller 12 within a predefined interval. The VCM 30 may dynamically adjust the value of Vref to the respective DIMM 20 to improve or optimize the Vref value for different intensity values.

Figure 2:
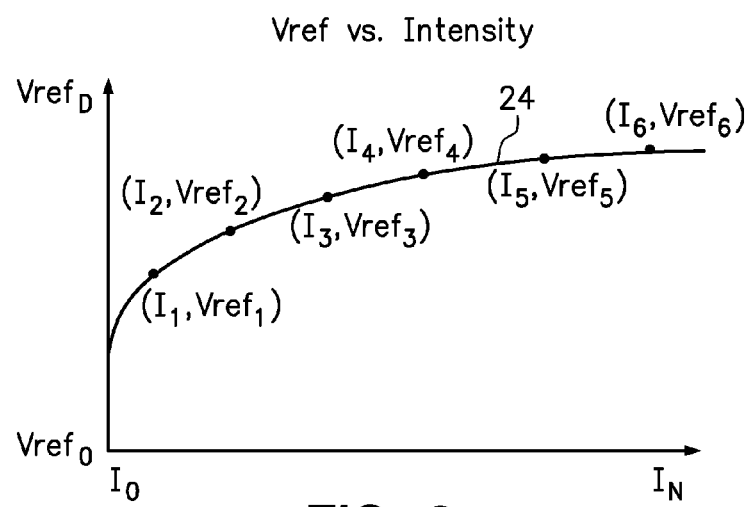
FIG. 2 is a graph of reference voltage (Vref) as a function of the traffic intensity for a particular digital signaling system, such as the computer memory system of FIG. 1.

FIG. 2 is a graph indicating how a reference voltage (Vref) varies as a function of the traffic intensity for the computer memory system 10 of FIG. 1. The actual variation of Vref with traffic intensity for a particular system depends entirely upon the characteristics of that system, and the graph of FIG. 1 is provided merely as an example for discussion purposes. The graph includes a hypothetical curve 24 showing an empirically-determined reference voltage value (Vref$_N$) as a function of traffic intensity (I$_N$) for the signaling system. The relationship between Vref$_N$ and I$_N$ described in the curve 24 may be stored in a lookup table (LUT—See FIG. 3) as an ordered pair (I$_N$, Vref$_N$) defining points along the curve. Seven different sample points are plotted, by way of example, along a curve 24, from (I$_0$, Vref$_0$) to (I$_6$, Vref$_6$). Typically, tens of these values are likely to be stored in the LUT. For example, in the memory system 10, about forty values are likely to be stored. These values, which are stored as data in the LUT, may be used to dynamically vary Vref as a function of I$_N$. For example, the VCM 30 of FIG. 1 may continuously or periodically monitor the traffic intensity to a target DIMM and reference the LUT to dynamically adjust Vref.

In the Vref-versus-Intensity graph of FIG. 2, the preferred or optimal value of Vref is shown to increase with increasing traffic intensity. However, the curve 24 represents a purely hypothetical relationship, as the optimal value of Vref does not necessarily increase continually with increasing traffic intensity. For example, the curve could alternatively be polynomial in nature. The shape of the curve 24 depends upon the level of traffic intensity, environmental conditions, and electronic noise conditions specific to the represented system.

One reason that the optimal value of Vref may increase with traffic intensity is that the increasing noise levels will add to the driver voltage (Vddq), and hence the signal voltage at a receiver pin. The system 10 accounts for all the various conditions such as noise, cross-talk, Vddq tolerance, Vref tolerance, and so forth, and uses traffic intensity as a single metric to represent the cumulative effect of these conditions on signal voltage at the receiver end. This is represented as a value of Vref required to achieve maximum margin for the signal under those particular environmental conditions. In the illustrated example, the empirically-determined value of $Vref_0$ under idle conditions is at its lowest value. Thus, in the illustrated example, $Vref_1 > Vref_0$, $Vref_2 > Vref_1$, and so forth. However, this trend is just one non-limiting example of how Vref may vary with intensity for a given system. As explained above, the particular system dynamics affecting the relationship between traffic intensity and reference voltage will vary from system to system.

A training phase may be performed to determine the relationship between Vref and traffic intensity for a particular system. The training phase is used to obtain the preferred or optimal Vref value at each of a plurality of different traffic intensities. The training phase may involve running a training pattern wherein a test signal is sent to the target receiver (e.g. target DIMM) at each of a plurality of different traffic intensities. The signal at the receiver pin may be sampled and measured, and a preferred or optimal value for Vref may then be determined for each identified level of traffic intensity. As part of an empirical determination of signal behavior during the training phase, the value of Vref may be varied for each value of traffic intensity to be examined. For each value of traffic intensity, the inner limits of the voltage eye may be determined by a value of Vref that causes the system to fail. An example of a training phase is provided in a flowchart in FIG. 6, as discussed below.

Figure 3:
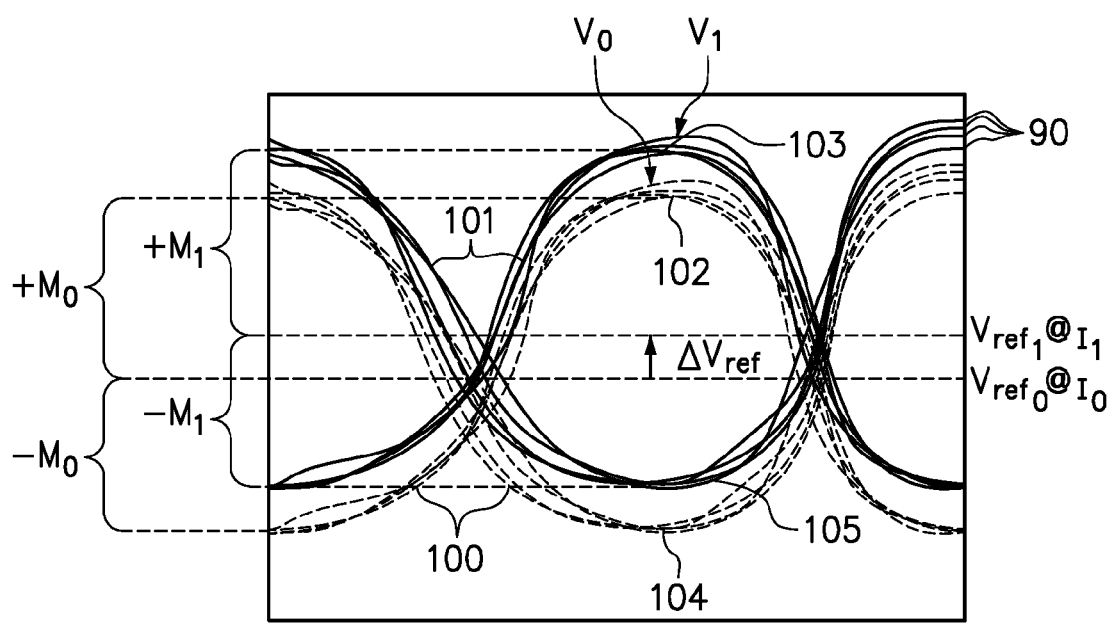
FIG. 3 is a superposition of two eye diagrams for a measured signal at different signal traffic intensities.

FIG. 3 is a superposition of two eye diagrams 100, 101 for a measured signal at different intensities ($I_0$ and $I_1$). The signal waveform and corresponding eye diagrams are of the type displayable on an oscilloscope, and have features (e.g. eye shape, eye height, eye width, DC offset, and so forth) generally recognized in the art. However, the eye diagrams 101, 102 are provided in FIG. 3 to facilitate a discussion and understanding of signal behavior in a system as affected by traffic intensity, and the use of an oscilloscope is not required in performing the method in accordance with this embodiment. Each eye diagram 100, 101 includes a superposition of multiple traces 90 of a modulated signal as received over a transmission line, which in this case may be the data line 16 in the memory bus 22 of FIG. 1. The signal waveform of the traces 90 represents the eye voltage, as taken at a DIMM receiver pin. In each eye diagram 100, 101, the traces 90 overlap with a tolerance related to timing jitter, noise, and other effects. When the driver voltage "Vddq" of a system varies because of noise coupling, it results in a corresponding change in the signal voltage that appears on the transmission line, and hence on the voltage that appears at the DIMM receiver pin. Thus the eye voltage is directly affected by noise on Vddq at the source end.

The traces 90 of the first eye diagram 100, representing the signal at intensity $I_0$, are drawn in a broken (phantom) line type. The traces 90 of the second eye diagram 101, representing the signal at intensity $I_1$, are drawn in a solid line type, to visually distinguish the two eye diagrams 100, 101 and to indicate a shift of the signal voltage as a result of the traffic intensity changing from intensity $I_0$ to intensity $I_1$. To simplify the discussion, increasing the intensity from $I_0$ to $I_1$ in this example results in a simple upward shift in the eye diagram from intensity $I_0$ to intensity $I_1$. However, a change in the traffic intensity to a receiver may result in more complicated and less predictable distortions of the signal waveform, such as changes in the eye shape, eye height, eye width, or DC offset. Any of these changes, or any combination thereof, may result in a shift of the optimal Vref.

According to an embodiment of the invention, Vref is dynamically adjusted as a function of intensity to compensate for any changes in eye voltage due to changes in traffic intensity targeting a receiver. The variation of the Vref up or down in relation to the intensity may be performed automatically within the chip. For each of a plurality of different traffic intensities, a corresponding Vref value may be empirically determined that provides reliable signaling at each intensity. For example, a separate Vref may be selected for each traffic intensity to maximize the voltage margin between the signal and Vref at each traffic intensity. For example, in FIG. 3, a reference voltage $Vref_0$ is selected at approximately midway between an average upper bound 102 (logical "1") and average lower bound 104 (logical "0") of the first eye diagram 100. A reference voltage $Vref_1$ is selected at approximately midway between an average upper bound 103 (also a logical "1") and lower bound 105 (logical "0") of the second eye diagram 101. The particular Vref selected for each identified traffic intensity preferably provides an equal voltage margin about that particular voltage reference. For example, a uniform voltage margin $+/-M_0$ is provided between the signal voltage $V_0$ and the reference voltage $Vref_0$, and a uniform voltage margin $+/-M_1$ is provided between the signal voltage $V_1$ and the reference voltage $Vref_1$. The optimal Vref value may be empirically determined at any number of intensity values, as described in the flowchart of FIG. 6, discussed below. The Vref values obtained may then be stored in an electronic lookup table (LUT), optionally indexed by intensity.

Figure 4:
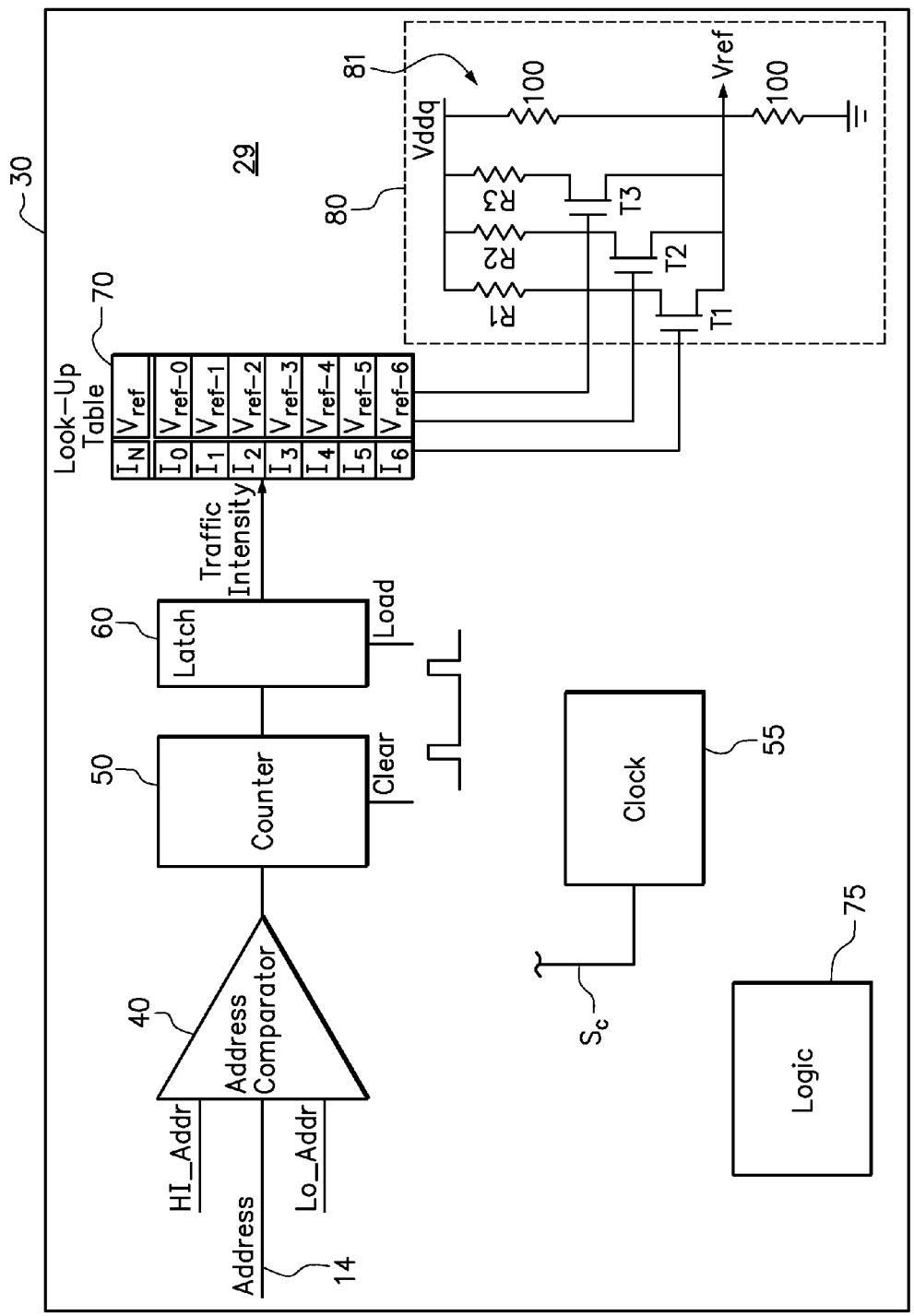
FIG. 4 is a more detailed schematic diagram of a voltage control module for controlling the reference voltage to a target DIMM.

FIG. 4 is a more detailed schematic diagram of a voltage control module (VCM) 30 for controlling the reference voltage Vref to a target DIMM. The VCM 30 includes an address comparator 40, a counter 50, a clock 55, a latch 60, a lookup table (LUT) 70, and a Vref leg 80 having a resistor network 81. The various components, schematically shown in FIG. 4, may be embodied as circuits on a substrate 29, providing communication lines (e.g. traces) between the various components. The address comparator 40 communicates with address line(s) 14 included with the memory bus 22 (FIG. 1). Each DIMM 20 (see FIG. 2) has a set of address registers uniquely defining an address space for that DIMM 20. The comparator 40 compares memory addresses received over the address line 14 with the address space of the DIMMs 20 to determine whether the associated DIMM is the target DIMM 20 at any given clock signal $S_C$ generated by the clock 55. This determination may be made, for example, by determining that the memory address is within the address range between "Hi_Addr" and "Lo_Addr." Signals that are addressed to a particular DIMM 20 by the memory controller 12 are received only by the target DIMM 20 and cause an increment in the counter 50 for that DIMM 20. The counter 50 may separately track the traffic to each DIMM 20, such as by having separate registers, each for tracking traffic to a specific DIMM 20. Thus, a separate value of Vref may specifically be tuned for each DIMM 20.

The latch 60 periodically captures the value of the counter 50 as a measure of the traffic intensity targeted to the target DIMM 20. A predefined interval may be selected for capturing the value of the counter 50. The interval may be measured in seconds, which may be timed by the clock 55, or as a fixed number of clock cycles generated by the clock 55. The latch 60 may capture the counter value upon expiration of the predefined interval, and a new interval of the same duration may begin timing upon expiration of the previous interval. A predefined interval having a fixed duration allows the intensity to be numerically expressed without specifically computing a rate. For example, a counter value of 10,000 represents twice the intensity of a counter value of 5,000 when averaged over the same time interval. In one embodiment, the predefined interval may be 1 microsecond, for example. However, the predefined interval could alternatively be a value of greater than or less than 1 microsecond. An appropriate value for the predefined interval may be system-dependent. The selected interval may depend upon various system parameters, such as the bus speed, the number of bits in the counter, and how dynamic the Vref tuning is desired to be.

The LUT 70 is an electronically-stored correlation of intensity values and corresponding Vref values, as may be obtained during the training phase. The LUT 70 is one example of how a functional relationship between intensity and Vref may be expressed in a machine-readable manner for the purpose of enabling a memory system to dynamically select a Vref as a function of the intensity of traffic to the DIMM 20. The data in the LUT 70 may be empirically determined for a particular memory system. A separate LUT 70 may be specifically determined and stored for each DIMM 20 in the system, or a separate subset of Vref-versus-intensity data for each DIMM 20 may be included in a single LUT 70. The Vref-versus-intensity data may be empirically determined by running training patterns with various intensities and determining the optimal Vref for each of a plurality of different intensities. In this example, the LUT 70 includes the seven ordered pairs $(I_N, Vref_N)$ plotted in the curve of FIG. 2, from $(I_0, Vref_0)$ to $(I_6, Vref_6)$. The table 70 is optionally indexed by intensity, to simplify lookup of corresponding Vref values.

The Vref leg 80 is a circuit of the VCM 30 used to selectively adjust the effective resistance in parallel, and causing the Vref level to vary accordingly, to enforce the Vref values as a function of the intensity values as provided in the LUT 70. In this example, the Vref leg 80 comprises a resistor network 81 having three resistors R1, R2, and R3, along with three transistors T1, T2, and T3. The resistor network 81 is inside the VCM 30, which resides on the processor 15 in this embodiment. The resistor network 81 sends out a Vref value from the VCM 30 to a circuit board (e.g. motherboard) on which the processor 15 is mounted, with the control signals from the processor 15 communicated along the circuit board to the resistor network. The resistor network 81 could alternatively be located on the circuit board separate from the processor 15. However, including the resistor network 81 directly on the processor 15 desirably uses fewer pins of the processor 15. The transistors are controlled by internal logic 75 of the VCM 30. The transistors act as switches to bring the different resistors into the circuit as needed. This changes the number of resistors in parallel, which accordingly changes the net resistance of the Vref leg 80 and the corresponding Vref value. The resistors may each have a different resistance value, or all three resistors may have the same value, depending on the particular resistance values desired to enforce various Vref values.

Upon expiration of each predefined interval as measured by the clock 55, the latch 60 captures the value of the counter 50 as a measure of the traffic intensity to the DIMM 20. The captured value of the counter is used as an index to look up a corresponding Vref value from the LUT 70. If the exact value of $I_N$ and corresponding Vref value are not present in the LUT 70, the logic 75 may use any of a variety of steps to determine a suitable Vref value. For example, if the captured value of the counter 50 indicates an intensity value that is between two consecutive values in the LUT 70, the logic 75 may select the nearest $I_N$ value (above or below the captured intensity value) included in the LUT 70. Alternatively, the logic 75 may be used to interpolate a Vref value between the Vref values corresponding to the two consecutive $I_N$ values in the LUT table. In a further option, if the $I_N$ value is outside the range of $I_N$ values in the LUT 70, the logic 75 may be used to extrapolate a Vref value.

The number of resistors in the resistor network 81 and the resistance selected for each resistor may be selected to provide the desired resolution of the Vref leg 80. For example, increasing the number of resistors may increase the number of effective resistance values obtainable, and the corresponding number of different Vref values enforceable by the VCM 30. Thus, a greater number of resistors may enable a greater number of useful $(I_N, Vref_N)$ pairs stored in the LUT. The number of $(I_N, Vref_N)$ pairs stored in the table may be limited to a sufficient number to achieve a desired level of resolution. The resolution may be determined, for example, by the voltage difference between consecutive Vref values enforceable by the VCM 30.

Figure 5:
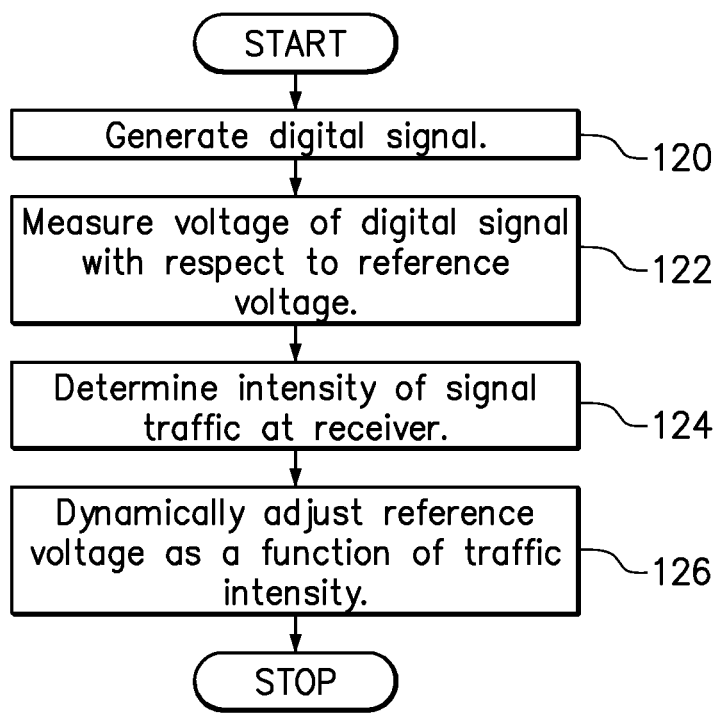
FIG. 5 is a flowchart of a method of dynamically adjusting a reference voltage to a receiver as a function of the traffic intensity to the receiver.

FIG. 5 is a flowchart summarizing a method of dynamically adjusting a reference voltage as a function of the traffic intensity to a receiver according to an embodiment of the invention. In step 120, a digital signal is generated. The digital signal is a modulated signal having an upper voltage range representing a logical "1" and a lower voltage range representing a logical "0." The digital signal is measured with respect to a reference voltage in step 122. In step 124, the traffic intensity of the digital signal to a receiver is determined. The traffic intensity is not a voltage measurement, but rather a measure of how frequently the receiver is targeted by memory traffic. Most memory systems include multiple receivers (e.g. DIMMs), so that the signal traffic is distributed among the various receivers. The signal traffic is typically not evenly distributed to the DIMMs, and each DIMM will therefore receive a different volume and traffic intensity. For example, in the embodiment of FIG. 4, the step of determining the intensity may involve counting how many times a target DIMM is addressed by a memory controller within a predefined time interval, and enforcing a predetermined Vref value. In step 126, the reference voltage is dynamically adjusted as a function of the intensity.

Figure 6:
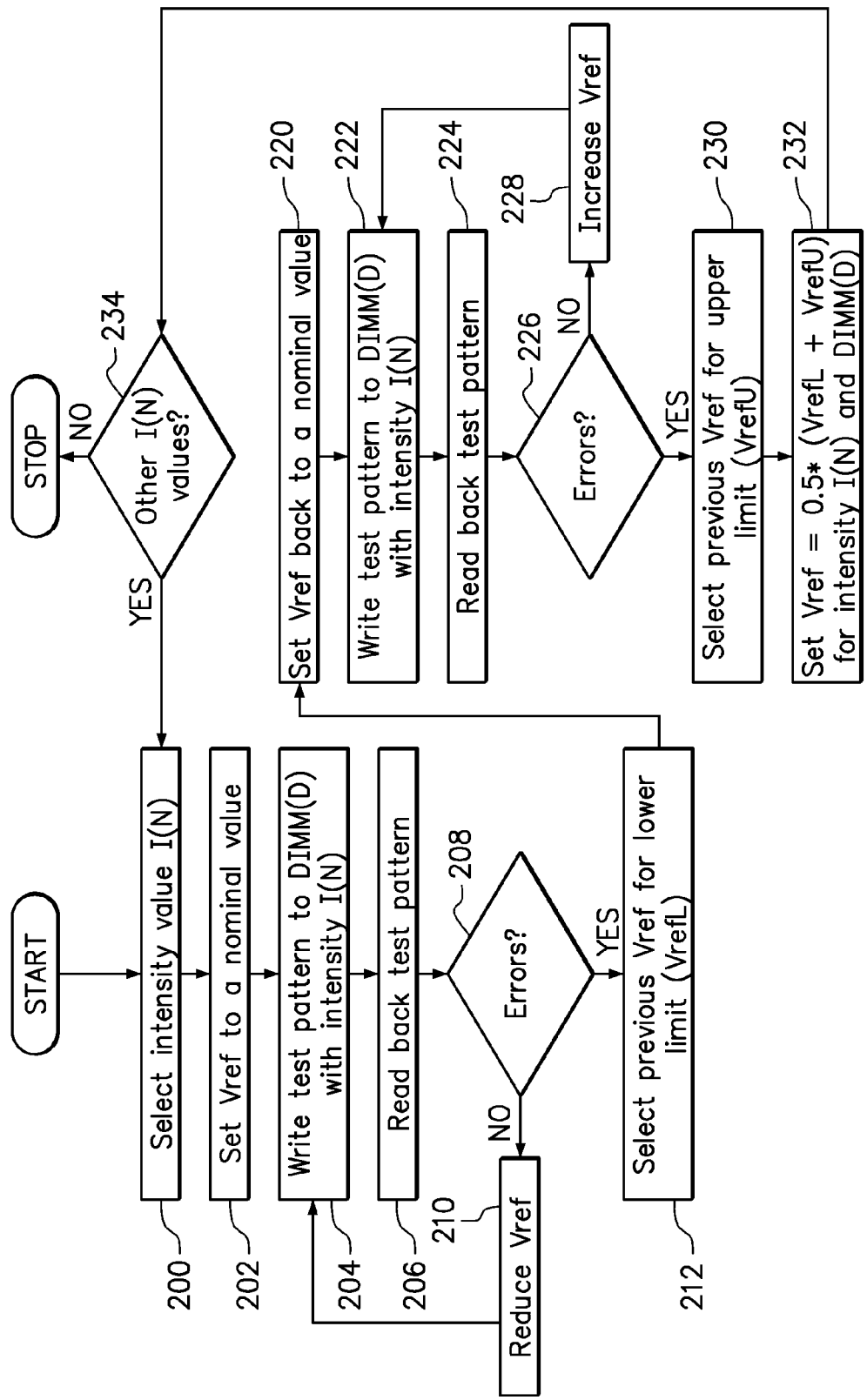
FIG. 6 is a flowchart outlining a Training Phase for obtaining suitable reference voltage values used to operate a DIMM over a range of different traffic intensities.

FIG. 6 is a flowchart outlining a Training Phase for obtaining suitable reference voltage values used to operate a DIMM over a range of different traffic intensities. The training phase may be used to determine a relationship between reference voltage (Vref) and intensity for a plurality of intensity values I(N) to maximize reliability for a particular system over the range of intensity values. The intensity values and corresponding Vref values will be stored as a function of Vref for subsequent lookup. Circuit elements referenced in discussing the flowchart (e.g. LUT) may be informed by way of example provided in the preceding discussion of FIGS. 1-5, such as with reference to the discussion of computer memory system of FIG. 1 and the VCM of FIG. 4.

The flowchart of FIG. 6 illustrates the Training Phase for only one of a plurality "D" of DIMMs. The Training Phase may be performed separately for each of the other DIMMs. The Training Phase is directed to determining a suitable reference voltage value providing reliable signaling for each of a plurality of different traffic intensities to the DIMM. One of the intensities value is first selected in step 200. In step 202, a nominal value is selected for the Vref. The nominal value of Vref may be any Vref value, but is preferably somewhere between upper and lower Vref limits, as determined below. In step 204, a predetermined test pattern is written to one of the DIMMs at the intensity value selected in step 200. The test pattern includes a predetermined set of values to be written, such as a selected pattern of binary 0s and 1s.

The data actually written to the DIMM in step 204 is read back in step 206 and compared with the originating test pattern to see how accurately the test pattern was written. Conditional step 208 checks for errors. Typically, if the value of Vref used when writing the test pattern was within an acceptable range of Vref values for the selected traffic intensity, the test pattern will be accurately written, with few or no errors. An error threshold may be selected to define what is an unacceptable level of error. The error threshold may be a certain minimum number of errors required to flag an "unacceptable" level of error. The error threshold may be as few as one error, meaning that even a single error in writing the test pattern indicates that the selected Vref value is unacceptable. However, any number of errors may be selected as the error threshold, according to the desired level of accuracy desired by the system designer.

If the error threshold was not reached according to conditional step 208 (indicating the current Vref value is within an acceptable range), then the value of the Vref is reduced slightly (such as by a preselected increment) in step 210. The test pattern is then repeated according to step 204, using the same intensity value used on the previous iteration, but at the newly decreased Vref value. This conditional loop from step 204 to step 208 is repeated until a value of Vref is found that causes the system to reach the error threshold according to conditional step 208. Reaching the error threshold indicates an unacceptable level of accuracy, and that the currently selected value of Vref falls below the acceptable range of Vref values at the current intensity. According to step 212, the preceding Vref value, which was determined to produce an acceptable level of accuracy at the present intensity value, is then set as the lower limit of Vref ("VrefL").

An upper limit of Vref ("VrefU") for the present intensity value is similarly determined. In step 220, the value of Vref is again set to a nominal value. The nominal value of Vref selected in step 220 may be the same nominal value of Vref selected in step 202, or to a value slightly higher than the nominal value selected in step 202, since the DIMM has already been tested for the current intensity value and at the nominal Vref value selected in step 202. In step 222, a test pattern is written to the DIMM at the nominal Vref value. The test pattern is preferably the same test pattern previously used in step 206. In step 224, the as-written test pattern is read back, just like in step 206. Conditional step 226 involves checking for errors in the read-back test pattern, just like in step 208. As in step 208, the number of errors may be compared with an error threshold selected to flag an unacceptable level of error. If the error threshold has not been reached in step 226, then the Vref is increased by a preselected increment in step 228, and the same test pattern is written to the DIMM in step 222 at the newly selected (higher) Vref value. This conditional loop from step 222 to step 226 is repeated until the error threshold is met in step 226. In response to reaching the error threshold in step 226, the preceding Vref value, which produced an acceptable level of accuracy, is selected for the upper reference voltage limit VrefU in step 230.

The determination of an upper reference voltage limit VrefU and a lower reference voltage limit defines a range of acceptable Vref values for the currently-selected intensity value I(N). This process may be repeated for each of the plurality of different intensity values, so that an acceptable range of Vref values may be obtained at each intensity value.

At a minimum, the value of Vref could be controlled during subsequent operation of the DIMM such that Vref is within its empirically-determined acceptable range at each value of traffic intensity. However, the flowchart of FIG. 6 provides an additional step 232 of selecting an "optimal" Vref for each intensity value that is at least approximately halfway between the upper and lower Vref limits VrefL and VrefU. More particularly, step 232 determines the average of the selected upper and lower limits. While any Vref value within the selected range of Vref values has been defined as providing an "acceptable" level of accuracy for the corresponding traffic intensity, a Vref value near the middle of the range may still produce a higher level of accuracy than Vref values closer to the upper or lower limits VrefU, VrefL. For example, if the error threshold (see steps 208, 226) defines the acceptable level of accuracy as up to five errors per test pattern, it may be that selecting the Vref value midway between these limits will consistently result in nearly zero errors. Thus, the Vref value computed in step 232 may be described as the "optimal" Vref value at a given traffic intensity.

The correlation between Vref values and traffic intensity values obtained in the Training Phase of FIG. 6 may be stored in a lookup table (LUT). A separate LUT may be obtained for each DIMM in a particular memory system. Thus, the Training Phase may be performed for each DIMM in the memory system, to obtain an optimal correlation between Vref and I for seeding an LUT specific to each DIMM. Each LUT generated during this Training Phase may then be used as a reference to control Vref as a function of I in subsequently writing to the respective DIMM during the Execution Phase described in FIG. 7.

Figure 7:
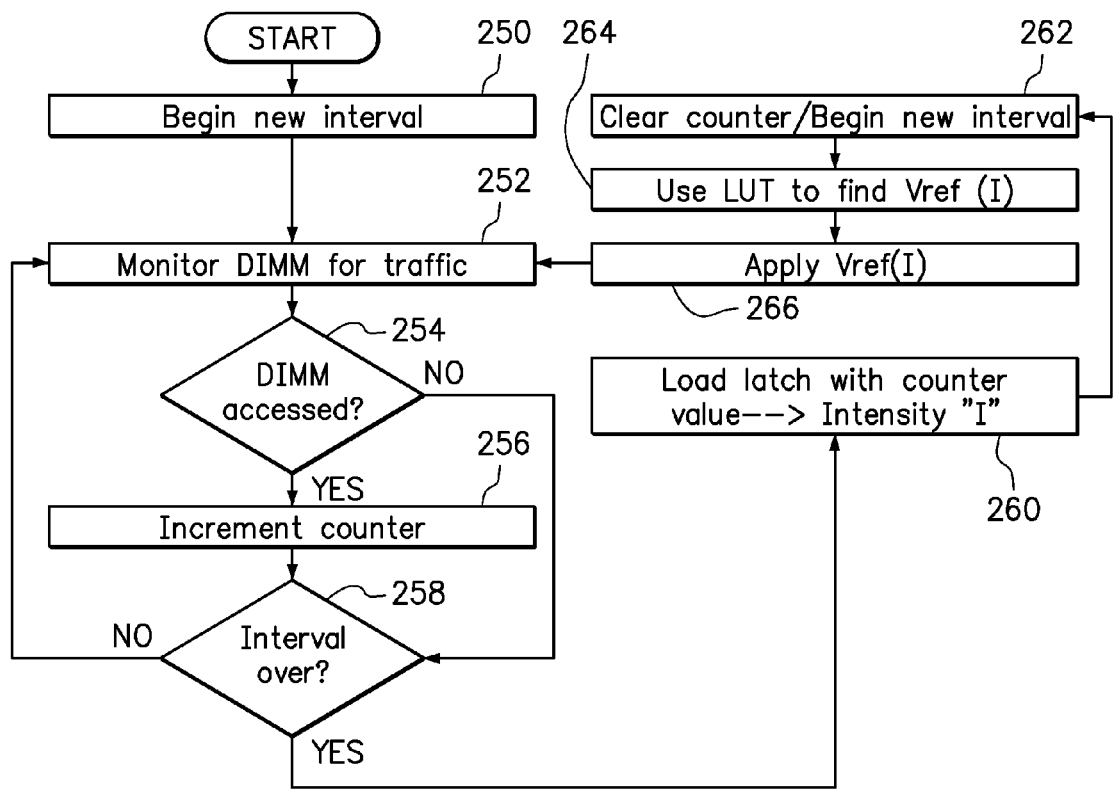
FIG. 7 is a flowchart outlining an Execution Phase for controlling reference voltage to a DIMM for which the Training Phase of FIG. 6 has been performed.

FIG. 7 is a flowchart outlining an Execution Phase for controlling reference voltage to a DIMM for which the Training Phase of FIG. 6 has been performed. During the Execution Phase, traffic to a target DIMM is monitored to determine traffic intensity to that DIMM, and the Vref is dynamically varied according to the Vref values stored in the LUT. In step 250, an interval (e.g. a predefined time interval or a predefined number of clock cycles) is begun. During the interval, the traffic to a particular DIMM (the target DIMM) is monitored according to step 252. According to conditional step 254, each time the DIMM is accessed by the memory controller, a counter for the DIMM is incremented in step 256. Conditional step 258 determines when the current interval has elapsed.

Once the interval is over, a latch is loaded with the present counter value in step 260. The latched counter value is used to determine the intensity value over the interval that was just concluded. In step 262, the counter is cleared and a new interval is begun. Optionally, a new interval may be begun immediately, without waiting for the completion of subsequent steps 264, 266. In step 264 the intensity value captured by the latch is used as an index to reference the LUT, which was previously seeded in the Training Phase (see FIG. 6). The intensity value is used to obtain the corresponding Vref value for the captured intensity value. If the current intensity value falls between two consecutive intensity values in the LUT, or outside the range of LUT values, then a Vref value corresponding to the latched intensity value may be interpolated, or possibly extrapolated, from the values in the LUT. Alternatively, the latched intensity value may be rounded up or down to the nearest intensity value in the LUT, and the corresponding Vref value may be selected. According to step 266 the Vref value obtained in the LUT is applied to the DIMM. The steps of this Execution Phase are repeated continuously, periodically or in response to system events that might signify a change in traffic intensity, in order to dynamically vary Vref according to the changing intensity value.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method, comprising:
    generating a digital signal and a reference voltage with respect to which the digital signal is interpreted;
    selectively addressing a target memory module from among a plurality of memory modules;
    monitoring a changing traffic intensity to the target memory module; and
    dynamically adjusting the value of the reference voltage as a function of the changing traffic intensity.

2. The method of claim 1, wherein the target memory module is one of a plurality of different dual in-line memory modules independently addressable by the digital signal.

3. The method of claim 1, further comprising:
    quantifying the traffic intensity as the number of times the target memory module is addressed in a predefined interval.

4. The method of claim 3, wherein the predefined interval is a predefined time interval or a predefined number of clock cycles.

5. The method of claim 1, further comprising:
    detecting that an address signal is within an address range assigned to the target memory module;
    incrementing a counter in response to detecting that the address signal is within the address range assigned to the target memory module; and
    capturing the value of the counter upon expiration of a predefined interval as a measure of the traffic intensity at which the digital signal is directed to the target memory module.

6. The method of claim 1, further comprising dynamically adjusting the reference voltage to enforce a selected voltage margin between the voltage of the digital signal and the reference voltage.

7. The method of claim 1, wherein the step of dynamically adjusting the reference voltage comprises adjusting the effective resistance between a supply voltage and the reference voltage.

8. The method of claim 7, wherein the step of adjusting the effective resistance between a supply voltage and the reference voltage comprises selectively recruiting a selected subset of resistors in parallel.

9. The method of claim 1, further comprising:
    generating an electronic lookup table by empirically determining a suitable reference voltage for each of a plurality of different traffic intensities.

10. The method of claim 9, wherein the step of empirically determining a suitable reference voltage for each of a plurality of different traffic intensities comprises:
    generating a test pattern containing writeable data values;
    writing the test pattern to the target memory module at a selected traffic intensity for each of a plurality of reference voltage values;
    comparing each test pattern as written to the target memory module to the test pattern as generated to identify errors; and
    selecting one or more reference voltage values for which the identified errors do not exceed a predefined error threshold.

11. The method of claim 10, further comprising:
    selecting the lowest of the reference voltage values for which the identified errors do not exceed a predefined error threshold as a lower limit on a suitable reference voltage range; and
    selecting the highest of the reference voltage values for which the identified errors do not exceed a predefined error threshold as an upper limit on the suitable reference voltage range.

12. The method of claim 11, further comprising:
    subsequently writing to the memory module while controlling the reference voltage to be within the suitable reference voltage range when at the selected traffic intensity.

13. The method of claim 11, further comprising:
    averaging the upper limit and the lower limit obtained for each intensity value.

14. The method of claim 13, further comprising:
    subsequently writing to the memory module while controlling the reference voltage to be the averaged reference voltage for the selected traffic intensity.

* * * * *